United States Patent [19]

Wilber

[11] 4,394,572

[45] Jul. 19, 1983

[54] PHOTODETECTOR HAVING AN ELECTRICALLY CONDUCTIVE, SELECTIVELY TRANSMISSIVE WINDOW

[75] Inventor: Scott A. Wilber, Boulder, Colo.

[73] Assignee: Biox Technology, Inc., Boulder, Colo.

[21] Appl. No.: 250,955

[22] Filed: Apr. 1, 1981

[51] Int. Cl.³ .............................................. H01J 5/02
[52] U.S. Cl. .................................. 250/239; 250/216
[58] Field of Search ............... 250/211 R, 211 J, 216, 250/213, 239, 551; 343/711–713

[56] References Cited

U.S. PATENT DOCUMENTS 2,669,663  2/1954  Fankove ........................ 250/211 R
3,153,149  10/1964  Finigian ............................. 250/239

Primary Examiner—David C. Nelms
Attorney, Agent, or Firm—Daniel M. Rosen

[57] ABSTRACT

A photodetector including a photosensitive material which changes its electrical properties in response to radiation striking the material, and particularly radiation of a wavelength at or near that of light, positioned within an electrically conductive enclosure and having a window transparent to the desired light and near light wavelengths positioned in an opening in such enclosure, the window being electrically conductive to protect the light sensitive material from various electromagnetic, radio frequency and similar interference.

12 Claims, 2 Drawing Figures

PHOTODETECTOR HAVING AN ELECTRICALLY CONDUCTIVE, SELECTIVELY TRANSMISSIVE WINDOW

BACKGROUND OF THE INVENTION

1. Field of the Invention

The present invention relates generally to photodetectors for sensing and measuring radiant energy, and particularly visible, invisible and near light wavelength energy, and more particularly to a photodetector including an electrically conductive window which is transparent to the desired light and near light wavelengths while precluding interference in such desired measurements by other electromagnetic radiation such as radio frequency interference, power line emissions and other spurious sources.

2. Description of the Prior Art

Photodetectors are generally available in the form of devices that sense illumination falling thereon. Measurements may be qualitative, i.e., the presence or absence of illumination, or quantitative, i.e., a measurement of the intensity of illumination thereon. Generally photodetectors take the form of a sensitive area which varies as to electrical properties as a function of light or related radiation striking the sensitive area. Typical of such known devices are photovaristors (commonly cadmium sulphide and lead telluride devices), phototransistors (typically junction transistors with the base exposed to a light source in order to modulate the collector current as a function of the light intensity striking the base), photodiodes (solid state diode devices in which PN junctions are sensitive to light incident thereon to alter current), photoresistor materials, photoconductive materials, photovoltaic cells, etc. In general the solid state devices such as phototransistors and photodiodes, and particularly photodiodes, are considered the more sensitive of the photodetector devices.

Photodetectors are often employed in very demanding and sensitive measurement processes. Typical of the demanding measurement processes involved are the non-invasive oximeter devices disclosed in Shaw U.S. Pat. No. 3,638,640 and Konishi et al U.S. Pat. No. 3,998,550. In such environments, the photodetector is placed adjacent a thin section of living tissue in order to measure the light passing through the tissue and, as a function of the light measured, determine the oxygenation of blood within such tissue. Clearly such determination may be, in some instances, a life and death measurement. The subjects of such determination may be patients exposed to a number of sources of interfering radiation. Surgical patients, for example, are often monitored by a number of devices, i.e., electrocardiograms, electroencephalograms, and other body function measuring electronic devices, as well as being subject to radio frequency currents utilized in electrosurgery. Accordingly, the patient's body is a significant source of static electricity and various electromagnetic radiation including radio frequency interference and 60 Hz AC emissions. Such radiation is fully capable of registering spurious signals in photodetectors, and particularly solid state photodetectors. By rectifying such radiation, the photosensitive material, in the case of solid state photodetectors, may produce a current. Also, conductance of the photodetector may be induced by a "field effect" caused by such interference. For these reasons, a significant problem exists with conventional photodetectors utilized in an enviroment in which spurious signals may be induced as a result of these various electromagnetic energy sources other than the desired radiant energy, which is typically visible, invisible and near light frequency energy.

SUMMARY OF THE INVENTION

The present invention, which provides a heretofore unavailable improvement over previous photodetectors for selected light and near light wavelength energy detection and/or measurement, comprises a photosensitive material carried within a conductive case having defined therein a window transparent to the desired light and near light wavelengths and also conductive to isolate the photosensitive material from various interferences such as static electricity, radio frequency, AC power line couplings, and other such electromagnetic radiation. Preferably the window is formed of glass or similar vitrious materials, or crystalline substances such as quartz, and includes an electrically conductive thin coating of metal or metal oxide thereon with the metal oxide being sufficiently thin to be transparent to the desired wavelengths. Alternatively the window may be of a conductive vitrious, or other homogenous, material.

Accordingly, an object of the present invention is to provide a new and improved photodetector for selective wavelengths of energy which is insensitive to non-selected wavelengths of electromagnetic energy to preclude or reduce spurious signals induced by the non-selected wavelengths of energy.

Another object of the present invention is to provide a new and improved photodiode structure which is insensitive to other than light and near light energy wavelengths.

Yet another object of the present invention is to provide a new and improved photodetector which may be conveniently and economically produced utilizing conventional photodetector structures.

These and other objects and features of the present invention will become apparent from the following description.

DETAILED DESCRIPTION OF THE INVENTION

Figure 1:
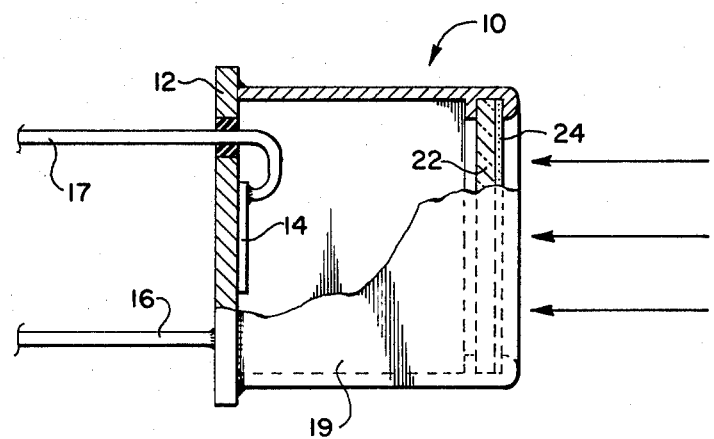
FIG. 1 is a partially cut away and sectioned view of a photodiode photodetector in accord with a preferred embodiment of the invention.

Turning now to the drawings, wherein like components are designated by like reference numerals throughout the various figures, a photodetector in accord with the instant invention is illustrated in FIG. 1 and generally designated by reference numeral 10. Photodetector 10 is specifically configured as a photodiode, since a photodiode is one of the more sensitive of photodetectors, and thus presents a more difficult case. However, it is to be understood that while photodetector 10 is illustrated specifically with regard to one of the more demanding applications of the invention, applicability of the concept is not limited to such specific example.

Photodetector 10 includes an electrically conductive case 12, which is typically formed of metal, carrying on a wall thereof photosensitive material 14. As is well known, photosensitive material 14 comprises a PN junction which, when a potential is provided across such junction, is sensitive to photons and other radiant energy to provide a hole-electron pair, thereby inducing conductance in photosensitive material 14 as a function of the radiation striking such material. As illustrated, electrode 16, through contact with case 12, is in electrical contact with one portion of photosensitive material 14, while electrode 17 is connected to photosensitive material 14 such that an electrical circuit between electrodes 16 and 17 can be completed only through photosensitive material 14.

At end end of case 12 opposite that at which photosensitive material 14 is positioned, a transparent window 22 is hermetically sealed therein to permit transmission of photons in the form of visible, invisible and near light wavelength energy. As a preferred but not limiting embodiment of the invention, conductive layer 24 is provided on at least one surface of window 22, typically at least the outer surface in most instances to act as anti-reflective as well as conductive layer, with conductive layer 24 also electrically in contact with case 12. Thus the composite of window 22 and conductive layer 24, in conjunction with case 12, functions to completely surround photoconductive material 14 with a conductive barrier thereby precluding many forms of interference radiation from photosensitive material 14.

Figure 2:
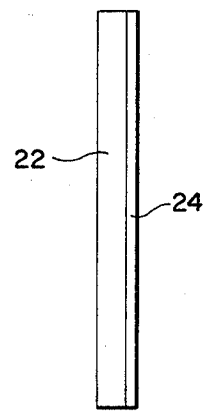
FIG. 2 is a side view of a preferred embodiment of the window employed in the photodetector of FIG. 1.

Conductive layer 24, as illustrated in FIG. 2, may be formed in a number of well known manners. A thin layer of metal, preferably a non-oxidizable, noble metal such as gold, may be sputter coated in a very thin layer onto window 22 to provide an electrically conductive layer which is transparent to desired wavelengths of light. While thin sputter coatings of reduced metal are operable, the process and materials tend to be expensive. The more commonly available metals when sputter coated are subject to oxidation which may compromise the conductivity and transparency required of thin layer 24. In many instances, layer 24 may be more conveniently and economically produced by applying solutions or vapors of metal compounds to window 22, and then pyrolytically decomposing such compounds to form metal oxide coatings which are transparent and electrically conductive. Such processes are well known for, as an example, producing transparent, conductive resistance heating coatings on aircraft windshields etc. Vapors of stannic chloride are conveniently pyrolyzed to form a transparent, conductive and stable layer of tin oxide, which is quite suitable as conductive layer 24. Various other methods for producing transparent, electrically conductive layers may also be employed.

In summary, the photodetector of the instant invention provides heretofore unavailable discrimination between light and near light wavelength energy, and interference resulting from static electricity and various radio frequencies and other electromagnetic energy forms. While the preferred embodiment involves a transparent window carrying thereon a thin, transparent, electrically conductive layer, it is also contemplated and possible to produce a transparent glass substance which itself is electrically conductive as a substantially homogeneous, as opposed to layered, structure. Depending on the wavelengths of concern, the transmission of the window may be also carefully formulated to transmit or filter selective wavelengths of visible, invisible and near light wavelengths. Thus, in selective situations, the photodetector of the instant invention not only rejects electromagnetic and radio frequency radiation, but may also reject undesirable ambient or other light. The window may be vitrious, crystalline or polycrystalline.

Although only limited embodiments of the present invention have been illustrated and/or described, it is anticipated that various changes and modifications in the present invention will be apparent to those skilled in the art, and that such changes and modifications may be made without departing from the scope of the invention as defined by the following claims.

I claim:

1. A photodetector device having substantially decreased sensitivity to various electromagnetic interferences, the device comprising:
   an electrically conductive case having a hollow interior portion;
   a photosensitive material positioned within the case;
   an opening defined in a portion of the case; and
   an electrically conductive window structure transparent to selected wavelengths of energy positioned within the opening to enclose the interior of the case, the electrically conductive window being in electrical contact with the electrically conductive case;
   whereby the window may pass radiation of selected wavelengths while isolating the photosensitive material from interference energy of non-selected wavelengths.

2. A photodector device as set forth in claim 1 in which the photosensitive material is selected from the group consisting of cadmium sulfide, lead telluride and semiconductor materials.

3. A photodetector device as set forth in claim 2 in which the photosensitive material is configured as a photodiode.

4. A photodetector device as set forth in claim 1 in which the electrically conductive case is a metal case.

5. A photodetector device as set forth in claim 1 in which the window structure is comprised of a non-conductive substrate having at least one electrically conductive, transparent layer formed thereon.

6. A photodetector device as set forth in claim 5 in which the conductive layer is a layer of thin, transparent and electrically conductive reduced metal.

7. A photodetector device as set forth in claim 5 in which the electrically conductive layer is a thin, transparent electrically conductive metal oxide layer.

8. A photodetector device as set forth in claim 7 in which the metal oxide layer is tin oxide.

9. A photodetector device as set forth in claim 5 in which the conductive layer is positioned at least on the outer portion of the window structure.

10. A photodiode device insensitive to interference radiation, the photodiode comprising:
    a metallic, electrically conductive case defining an internal void therein;
    a photosensitive diode material supported within the metallic case adjacent one wall thereof;
    an opening defined in the metallic case at a position opposite that at which the photodiode material is positioned; and
    a window structure transparent to light and near light wavelength radiation, the window structure being electrically conductive and positioned within the case opening to establish electrical contact with the metallic case;
    whereby the photosensitive diode material is isolated from interference radiation by the surrounding electrically conductive window structure and metallic case.

11. A photodiode device as set forth in claim 10 in which the window structure is in the form of a non-electrically conductive transparent substrate having thereon at least one layer of transparent, electrically conductive material.

12. A photodiode device as set forth in claim 11 in which the electrically conductive material is tin oxide.

* * * * *